United States Patent [19]
Lundberg et al.

[11] Patent Number: 5,811,998
[45] Date of Patent: Sep. 22, 1998

[54] STATE MACHINE PHASE LOCK LOOP

[75] Inventors: James R. Lundberg, Austin, Tex.; Gilbert M. Wolrich, Framingham, Mass.

[73] Assignee: Digital Equipment Corporation, Maynard, Mass.

[21] Appl. No.: 554,234

[22] Filed: Nov. 8, 1995

Related U.S. Application Data

[63] Continuation of Ser. No. 10,107, Jan. 28, 1993, abandoned.

[51] Int. Cl.⁶ .................................................. H03L 7/06
[52] U.S. Cl. ........................... 327/156; 375/376; 327/147
[58] Field of Search ...................... 375/373, 375, 375/376; 327/55, 73, 133, 155, 2, 147, 151, 156, 160; 307/269; 455/260, 265; 331/25

[56] References Cited

U.S. PATENT DOCUMENTS

| | | | |
|---|---|---|---|
| 3,789,308 | 1/1974 | Lowdenslager | 328/155 |
| 4,441,195 | 4/1984 | Baldwin et al. | 328/155 |
| 4,815,109 | 3/1989 | Kao | 375/120 |
| 4,975,651 | 12/1990 | Hagiwara | 328/155 |
| 5,012,198 | 4/1991 | Okawa et al. | 328/155 |
| 5,036,216 | 7/1991 | Hohmann et al. | 309/269 |
| 5,061,907 | 10/1991 | Rasmussen | 331/57 |
| 5,068,628 | 11/1991 | Ghoshal | 375/120 |

FOREIGN PATENT DOCUMENTS

| | | | |
|---|---|---|---|
| 0240232 | 10/1987 | European Pat. Off. | H03L 7/00 |
| 0318155 | 5/1989 | European Pat. Off. | H03L 7/00 |

OTHER PUBLICATIONS

S. Mori et al, "Performance Improvement of All Digial Phase Locked Loop With Adaptive Multilevel Quantized Phase Comparator"; The Transactions of the Institute of Electronics, Information and Comm. Engineers, vol. E72, No. 3, Mar. 1989, Tokyo, JP, pp. 194–201.

W. Rosnik, "All Digital Phase Locked Loops Using The 74HC/HCT297", Electronic Components and Applications, vol. 9, No. 2, 1989, Eindhoven, NL pp. 66–89.

Kurita et al., "PLL–Based BiCMOS On–Chip Clock Generator for Very High–Speed Microprocessor," IEEE Journal of Solid–State Circuits, vol. 26, No. 4, Apr. 1991, IEEE, New York, N.Y., pp. 585–589.

(List continued on next page.)

*Primary Examiner*—Wellington Chin
*Assistant Examiner*—Jean B. Corrielus
*Attorney, Agent, or Firm*—Krishnendu Gupta; Ronald C. Hudgens; Arthur W. Fisher

[57] ABSTRACT

A digital phase lock loop synchronizes a first signal to a second signal having a predefined frequency. The first signal usually has an instantaneous frequency greater than the predefined frequency, so that the first signal is constantly gaining phase with respect to the second signal. The digital phase lock loop performs periodic correction cycles by detecting a predefined phase relationship between the first signal and the second signal, and when the predefined phase relationship is detected, expanding the first signal in phase by a predetermined amount. Preferably, the first signal is generated by clocking a frequency divider with a clocking frequency, and the first signal is expanded in phase by inhibiting the clocking of the frequency divider for one clocking cycle for each correction cycle. Preferably, the predetermined phase relationship is detected when the second signal has a predetermined logic state coincident with clocking by the clocking signal and a predetermined state of the frequency divider. The digital phase lock loop can be used in a data processor system for synchronizing data processor clocks to a reference clock at a submultiple of the data processor clocking frequency, by obtaining each data processor clock from an initial stage of the frequency divider in a digital phase lock loop for each processor.

25 Claims, 7 Drawing Sheets

OTHER PUBLICATIONS

Miyazawa et al., "A BiCMOS PLL–Based Data Separator Circuit With High Stability and Accuracy," IEEE Journal of Solid–State Circuits, vol. 26, No. 2, Feb. 1991, IEEE, New York, N.Y., pp. 116–121.

M.G. Johnson & E.L. Hudson, "A Variable Delay Line PLL for CPU–Coprocessor Synchronization," IEEE Journal of Solid–State Circuits, vol. 23, No. 5, Oct. 1988, IEEE, New York, N.Y., pp. 1218–1223.

L.A. Glasser & D.W. Dobberpuhl, *The Design and Analysis of VLSI Circuits*, Addison–Wesley Publishing Co., Reading, Mass., 1985, pp. 360–374.

M.W. Wakayama & A.A. Abidi, A 30–MHz Low–Jitter High–Linearity CMOS Voltage–Controlled Oscillator, IEEE Journal of Solid–State Circuits, vol. SC–22, No. 6, Dec. 1987, IEEE, New York, N.Y., pp. 1074–1081.

*RCA Integrated Circuits*, RCA Corp., Summerville, N.J., 1976, pp. 465–469.

STATE MACHINE PHASE LOCK LOOP

This application is a continuation of application Ser. No. 08/010,107, filed Jan. 28, 1993, now abandoned.

FIELD OF THE INVENTION

The present invention relates generally to digital electronics, and more specifically to a phase lock loop for synchronizing data processing units. In particular, the present invention relates to a phase lock loop using synchronous digital logic for phase modulation and phase detection.

BACKGROUND OF THE INVENTION

Synchronous interfaces are desirable for removing latency required for synchronizing signals transmitted across an asynchronous boundary between data processing units. This latency translates directly into a performance penalty.

One method of achieving a synchronous interface in a data processing system is to distribute a global clock to the data processing units in the system. With present levels of circuit integration, however, a microprocessor or interface chip can have significant clock loading that can require several stages of buffering before a final clock buffer has sufficient drive capability. The worst-case skew attributable to the buffering stages can be prohibitive and limit the performance of the system design. Another drawback of a global clock is that all components are constrained to run at a given clock frequency. Data processor frequencies, however, are usually much higher than the interface frequencies. It is thus desirable to have a mechanism that can synchronize the clocks of the data processing units to a reference clock of a lower frequency.

A digital phase lock loop is capable of achieving the desired synchronization. But there are drawbacks associated with conventional digital phase lock loops. A conventional digital phase lock loop includes a voltage-controlled oscillator and an analog loop filter. These components can either be off-chip, adding potential secondary noise problems, or on-chip, where the area required for implementation could be prohibitively large. There is also jitter associated with digital phase lock loops that causes clock phase contraction and thus negatively impacts performance. In addition, some environments, particularly CMOS, are traditionally noisy, exacerbating jitter and resulting in risk to both acquisition and maintenance of phase lock.

Delay lock loops are also capable of achieving the desired synchronization by control of delay in a delay line. But delay lock loops also have attendant drawbacks and risks. If the delay line uses an analog control voltage, it is subject to the same problems mentioned above for conventional phase lock loops. If the delay line uses digital delays, then there is a penalty of clock phase contraction incurred when the delay lock loop must decrement.

It is therefore desirable to eliminate the risk, performance penalties, and cost associated with synchronization by conventional techniques.

SUMMARY OF THE INVENTION

In accordance with a basic aspect of the present invention, a digital phase lock loop synchronizes a first signal to a second signal. The first signal has an instantaneous frequency that is usually greater than the frequency of the second signal, so that the first signal constantly gains phase with respect to the second signal. The digital phase lock loop selectively expands the phase of the first signal by a predefined amount when a predefined phase relationship is detected between the first signal and the second signal. The phase lock loop periodically follows a correction cycle, in which the phase of the first signal drifts with respect to the second signal until the predefined phase relationship is detected, and then the phase of first clock is selectively expanded.

In a specific implementation, the digital phase lock loop is comprised of synchronous logic clocked by a clocking signal, and therefore the digital phase lock loop is a "state machine." The first signal is generated by a frequency divider such as a counter clocked by the clocking signal, and phase expansion is performed by inhibiting the counter for one cycle of the clocking signal. A digital phase detector detects a predetermined phase error of one cycle of the clocking signal. The predetermined phase relationship is detected when the second signal has a predetermined logic state coincidence with clocking by the clocking signal and a predefined state of the frequency divider or counter. Noise immunity is achieved by requiring the predefined phase relationship to be detected over a plurality of cycles of the first and second signals before performing a phase expansion. Moreover, when a phase expansion is performed, the performance of a subsequent phase expansion is inhibited for a predetermined duration of time so as to limit the rate of phase expansion. Therefore, when the second signal is corrupted by noise, the average frequency of the first signal is constrained to be within predefined limits about the frequency of the second frequency.

BRIEF DESCRIPTION OF THE DRAWINGS

Other objects and advantages of the present invention will become apparent upon reading the following detailed description and upon reference to the drawings, in which.

While the invention will be described in connection with certain preferred embodiments, it will be understood that it is not intended to limit the invention to these particular embodiments. On the contrary, it is intended to cover all modifications, alternatives, and equivalent arrangements as may be included within the scope of the invention as defined by the appended claims.

DESCRIPTION OF THE PREFERRED EMBODIMENTS

Figure 1:
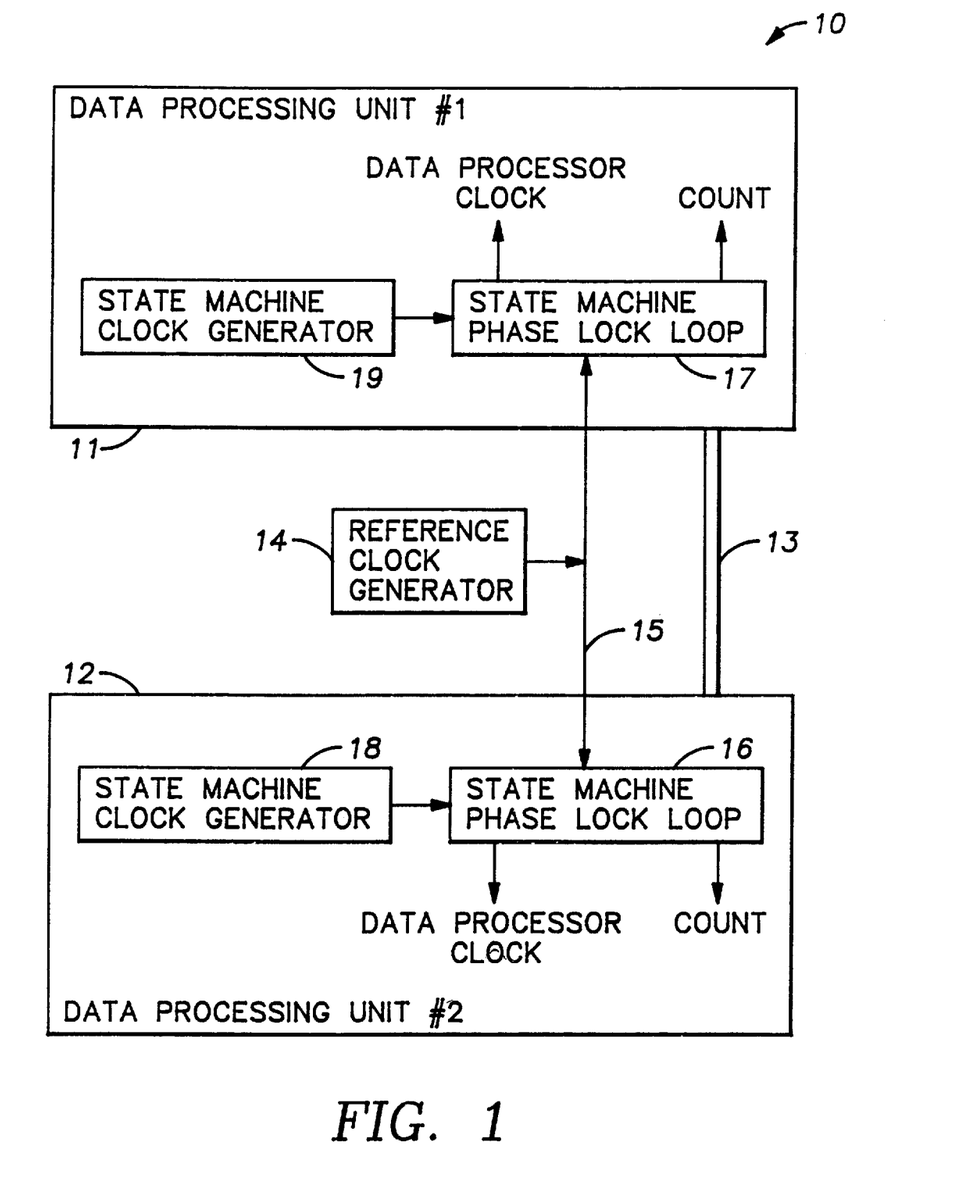
FIG. 1 is a block diagram of a data processing system using state machine phase lock loops in accordance with the present invention for synchronizing data processing units in the system.

Referring now to FIG. 1, there is shown a data processing system generally designated 10 including a first data processing unit 11 and a second data processing unit 12 interconnected by a data bus 13. The data processing units, for example, reside on separate circuit boards and include separate microprocessor chips. Due to the very high level of integration presently available for manufacturing microprocessor chips, the clocking frequency of each microprocessor chip exceeds the clocking rate which is convenient for transmitting data across the data bus 13. Therefore, some means is required for synchronizing the reception of data transmitted by one of the data processing units to the other of the data processing units. A most efficient way of synchronizing the reception of the data is to synchronize the two processors. Such synchronization of the data processing units in a computer system is also desirable in multiprocessing systems where certain transactions are issued time stamps for enforcing serialization orders of execution of the transactions.

One method of synchronizing data processing units is to use a common reference clock. As shown in FIG. 1, a reference clock generator 14 generates such a common reference clock which is distributed over a clock line 15 to the data processing units 11, 12.

In a common arrangement where a number of data processing units share a common reference clock, the reference clock is provided as the data processor clock to each of the data processing units. Due to the ever increasing clocking speed of the data processing units, however, it is becoming increasingly impractical to distribute such a high speed clock among a number of data processing units without the introduction of substantial clocking skew and noise. Therefore, it is desirable to distribute a reference clock that is at a submultiple of the clocking frequencies of the data processing units, and to use some kind of means for synchronizing the data processor clocks with the reference clock.

In accordance with an aspect of the present invention, each of the data processing units includes a state machine phase lock loop for generating a data processor clock synchronized to the common reference clock. Each of the state machine phase lock loops 16, 17 is clocked by a respective state machine clock generator, and each state machine phase lock loop selectively expands the phase of the data processor clock. Each state machine also provides a count to each data processor identifying the phase of the reference clock relative to the data processor clock.

In a specific example, the state machine clock generators provide a frequency slightly greater than six times the frequency of the reference clock generator 14, and the data processor clocks are synchronized to a frequency of three times the frequency of the reference clock generator.

Figure 2:
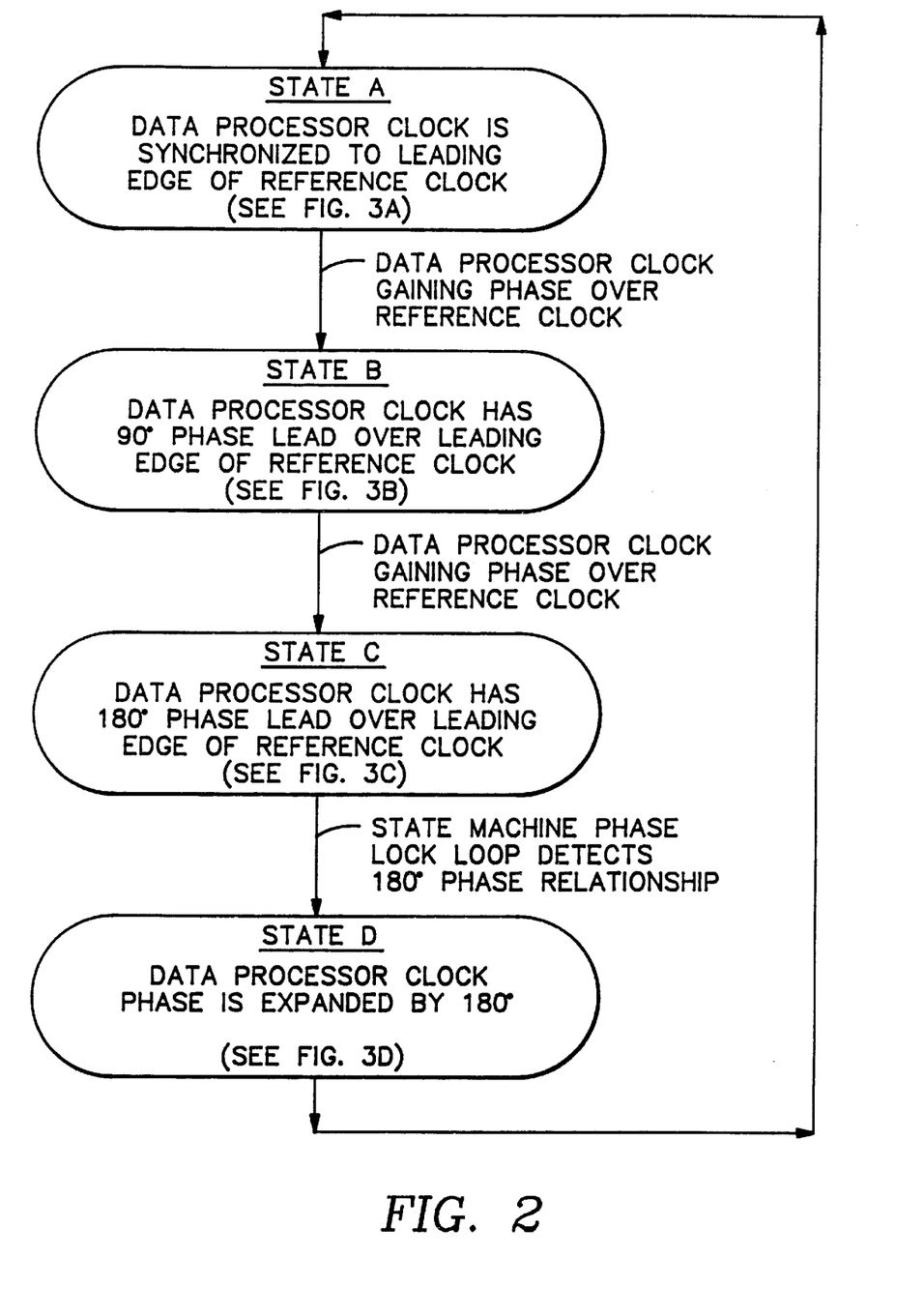
FIG. 2 is a flow diagram illustrating a phase correction cycle in the operation of specific embodiments of the present invention.
Figure 3A:
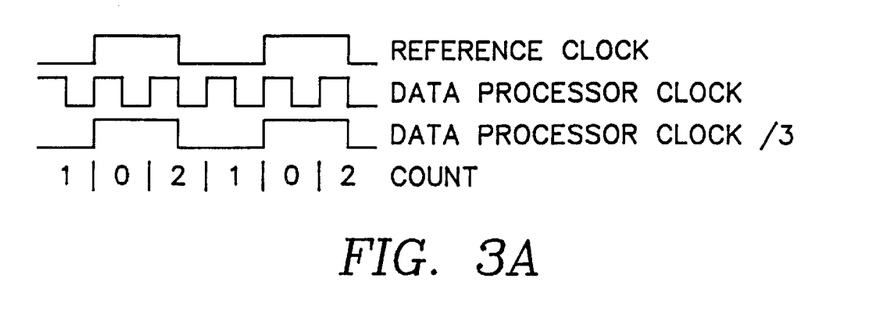
FIGS. 3A to 3D are timing diagrams illustrating the relative phase relationships between signals in the specific embodiments of the present invention for respective states in the flow diagram of FIG. 2.
Figure 3B:
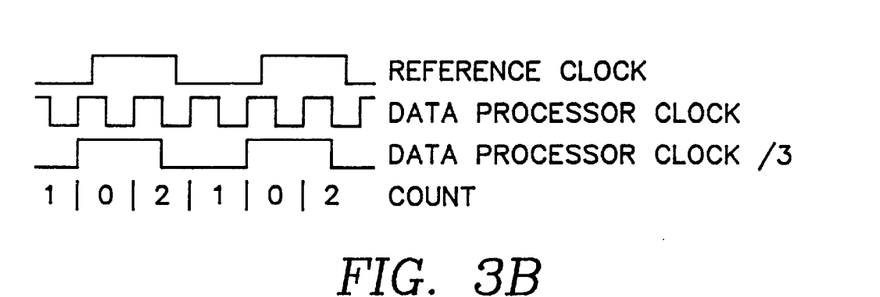
Figure 3C:
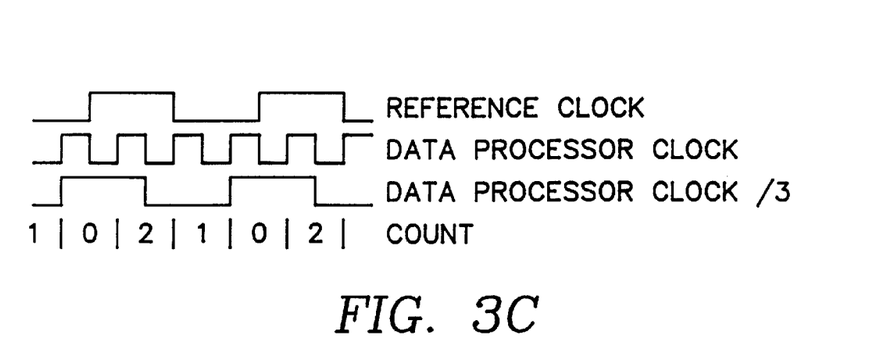
Figure 3D:
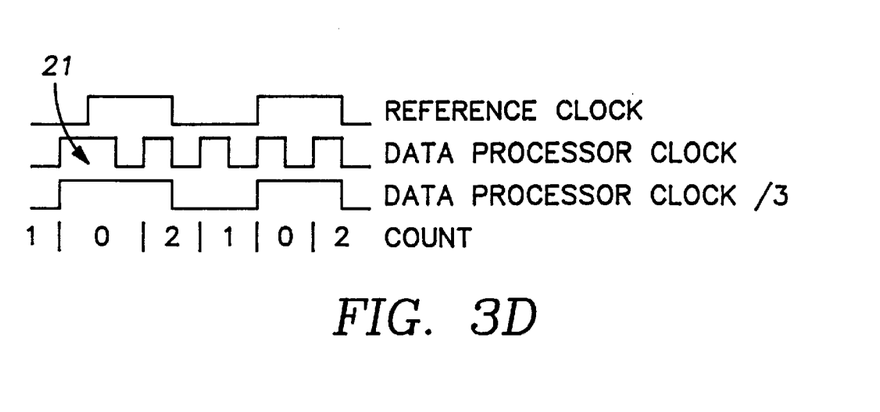

In accordance with another aspect of the present invention, a state machine phase lock loop selectively expands the phase of its respective data processor clock by a predefined amount during a phase correction cycle as illustrated in the flow diagram of FIG. 2. Shown in FIG. 2 are various states labeled STATE A, STATE B, STATE C, and STATE D, corresponding to relationships between the respective clocks as illustrated in FIGS. 3A, 3B, 3C, and 3D, respectively. In STATE A, and as shown in FIG. 3A, the data processor clock is synchronized to the leading edge of the reference clock. From this initial relationship, the data processor clock slowly gains phase over the reference clock, eventually reaching an intermediate relationship in STATE B, where the data processor clock has a 90° phase lead over the leading edge of the reference clock. This relationship is shown in FIG. 3B. The data processor clock continues to gain phase over the reference clock until a STATE C is reached, wherein the data processor clock has a 180° phase lead over the leading edge of the reference clock. This 180° phase relationship is illustrated in FIG. 3C. When the state machine phase lock loop detects this 180° phase relationship, a STATE D is reached, wherein the phase of the data processor clock is expanded by 180°, as shown in FIG. 3D. The phase expansion is performed during a single cycle, generally designated 21, of the data processor clock. This phase expansion causes an immediate synchronization of the data processor clock to the leading edge of the reference clock to achieve STATE A of the correction cycle.

Figure 4:
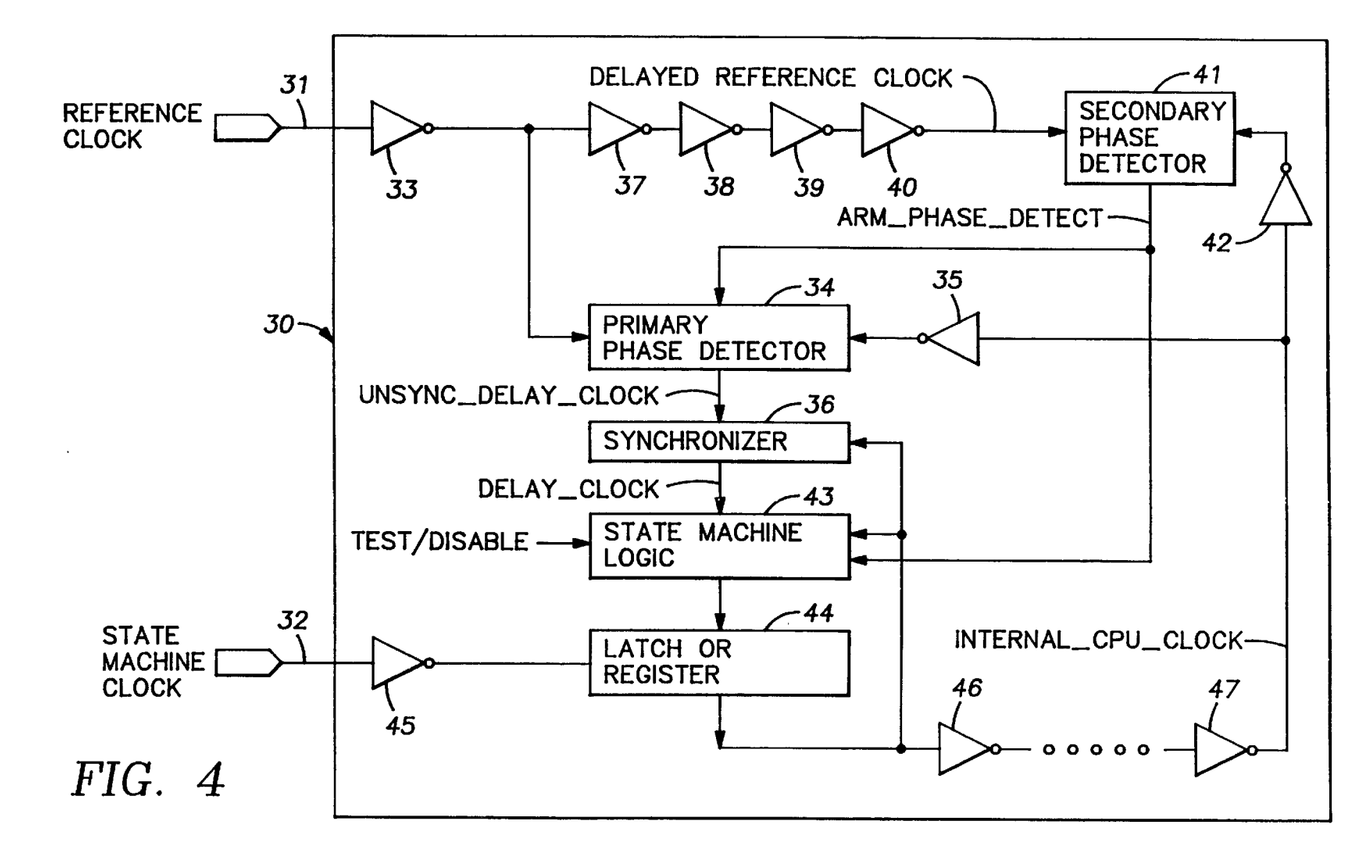
FIG. 4 is a block diagram of a first embodiment of the state machine phase lock loop of the present invention.

Turning now to FIG. 4, there is shown a block diagram of a first embodiment of a state machine phase lock loop incorporating the present invention. The state machine phase lock loop is fabricated on an integrated circuit chip 30, and provides an internal CPU clock signal to an on-chip data processor (not shown). The reference clock signal is supplied to a chip lead 31, and the state machine clock signal is supplied to a chip lead 32. The reference clock is fed through an inverter 33 to a primary phase detector 34, and the internal CPU clock is fed through an inverter 35 to the primary phase detector. The primary phase detector 34 detects when the internal data processor clock reaches the state shown in FIG. 3C. The output of the primary phase detector is a signal (UNSYNC-DELAY-CLOCK) that causes the state machine phase-lock loop to make a phase correction as shown in FIG. 3D. That signal (USYNC-DELAY-CLOCK) is fed through a synchronizer 36 so that the signal is synchronized to the state machine domain (which is an early version of the internal CPU clock) in order to prevent the propagation of a potential metastable signal into the state machine.

A delayed version of the reference clock is obtained by passing the reference clock from the inverter 33 through four additional inverters 37, 38, 39, and 40. The delayed reference clock is fed to a secondary phase detector 41, and the internal CPU clock is fed through an inverter 42 to the secondary phase detector. The secondary phase detector is used to enable the primary phase detector and can be used with other control logic, as shown below with reference to FIG. 5, to ensure that the state machine phase-lock loop does not make more than one phase expansion (21 in FIG. 3D) per correction cycle. The secondary phase detector 41 also ensures that there will not be a false detection due to inherent system jitter after a phase expansion. The secondary phase detector 41 output (ARM-PHASE-DETECT) and the synchronizer 36 output (DELAY_CLOCK) are fed to state machine logic 43. It is not necessary to synchronize the output of the secondary phase detector since a metastable state after a correction will have no effect on the primary phase detector or the state machine. By the time that a metastable state could affect the primary phase detector 34, the output of the secondary phase detector is guaranteed stable. Moreover, there is very little penalty in synchronizing the control signals since the internal CPU clock is drifting very, very slowly with respect to the reference clock. Thus, when the primary phase detector 34 has been triggered, the skew (a few picoseconds) introduced by the delay of the synchronizer 36 has a negligible impact on system jitter.

The state machine of FIG. 4 is the combination of the state machine logic 43 and a latch or register 44 that provides a feedback path to and from the state machine logic. The state machine clock on lead 32 is buffered by an inverter 45 and clocks the latch or register 44. An output of the latch or register 44 is buffered by a string of inverters 46, 47 to provide the internal CPU clock.

Figure 5:
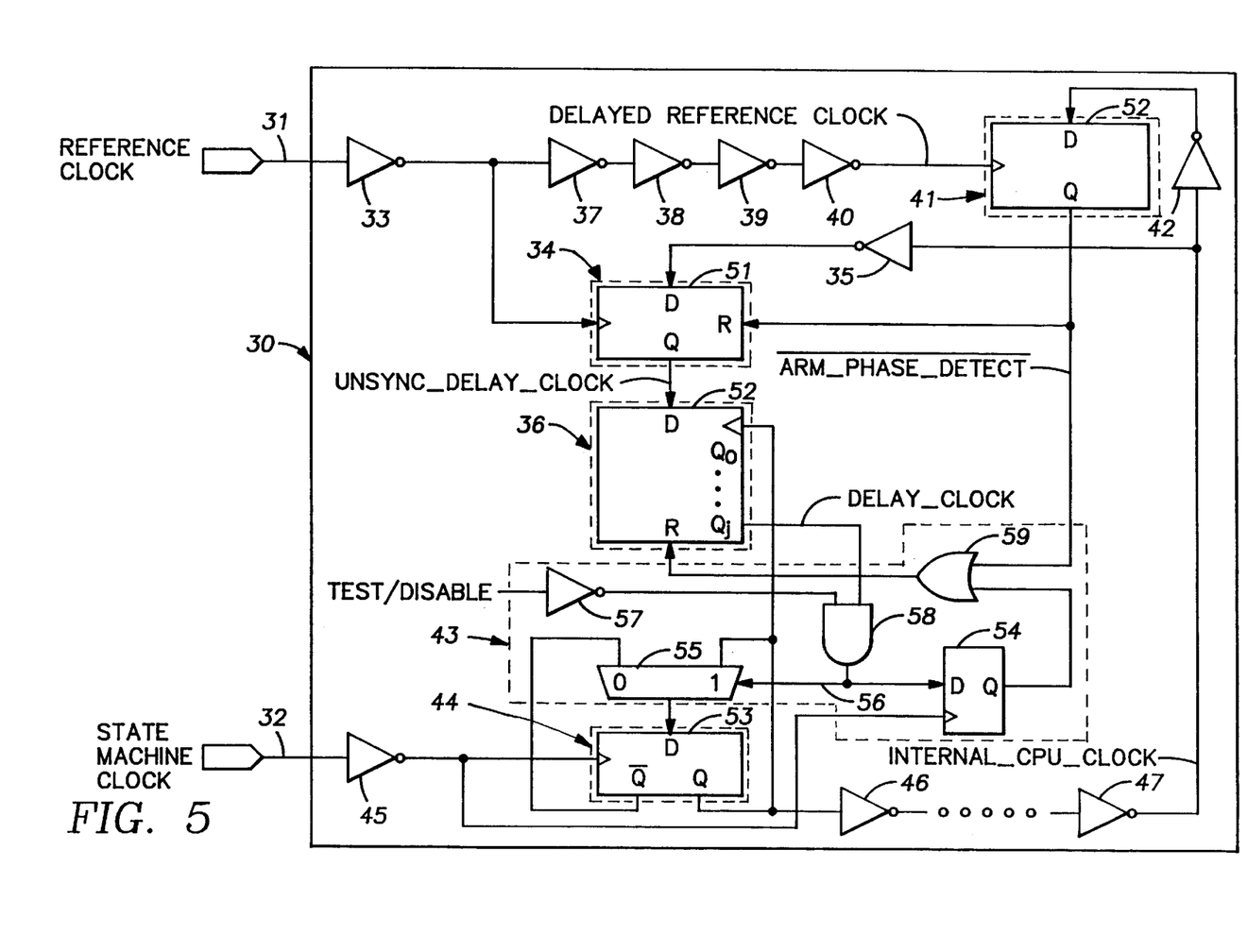
FIG. 5 is a schematic diagram of a specific circuit for the state machine phase lock loop generally shown in FIG. 4.

Turning now to FIG. 5, there is shown a schematic diagram of a specific circuit corresponding to the block diagram of FIG. 4. The primary phase detector 34 consists of an edge-triggered D flip-flop 51 having an asynchronous reset input (R). The D flip-flop 51 is clocked by the reference clock signal from the inverter 33, and samples the internal CPU clock signal from the inverter 35. The reset input (R) of the D flip-flop 51 receives the ARM_PHASE_DETECT signal, asserted low, from the secondary phase detector 41.

The secondary phase detector 41 consists of an edge-triggered D flip-flop 52. The D flip-flop 52 is clocked by the delayed reference clock from the inverter 40, and samples the internal CPU clock signal from the inverter 42.

The synchronizer 36 consists of a series of edge-triggered D flip-flops, which comprise a shift register 52. The shift register 52 has an asynchronous reset input (R), which is a parallel connection of asynchronous reset inputs of the respective D flip-flops which comprise the shift register.

The state machine logic 43 includes a multiplexer 55 connected to the D flip-flop 53 to form a toggle flip-flop that normally toggles unless an inhibit signal is asserted on a control input 56 of the multiplexer 55. This inhibit signal is responsive to the DELAY_CLOCK from the synchronizer 52. In response to a TEST/DISABLE signal asserted on an inverter 57, however, the state machine is disabled from making any phase corrections. For this purpose, the output of the inverter 57 is combined in an AND gate 58 with the DELAY_CLOCK signal to provide an output asserted on the control input.

In order to ensure that the state machine phase-lock loop does not make more than one phase expansion per correction cycle, the edge-triggered flip-flop 54 holds the toggle signal for one cycle of the state machine clock and uses it to reset the shift register 52. Therefore, the resetting of the shift register 52 disables the shift register from making successive phase expansions, one immediately after another. Moreover, the output of the flip-flop 54 is combined in an OR gate 59 with the ARM_PHASE_DETECT signal so that the secondary phase detector 52 will also prevent multiple phase expansions from occurring due to system jitter after a phase expansion. The shift register 52, for example, has three stages.

Figure 6:
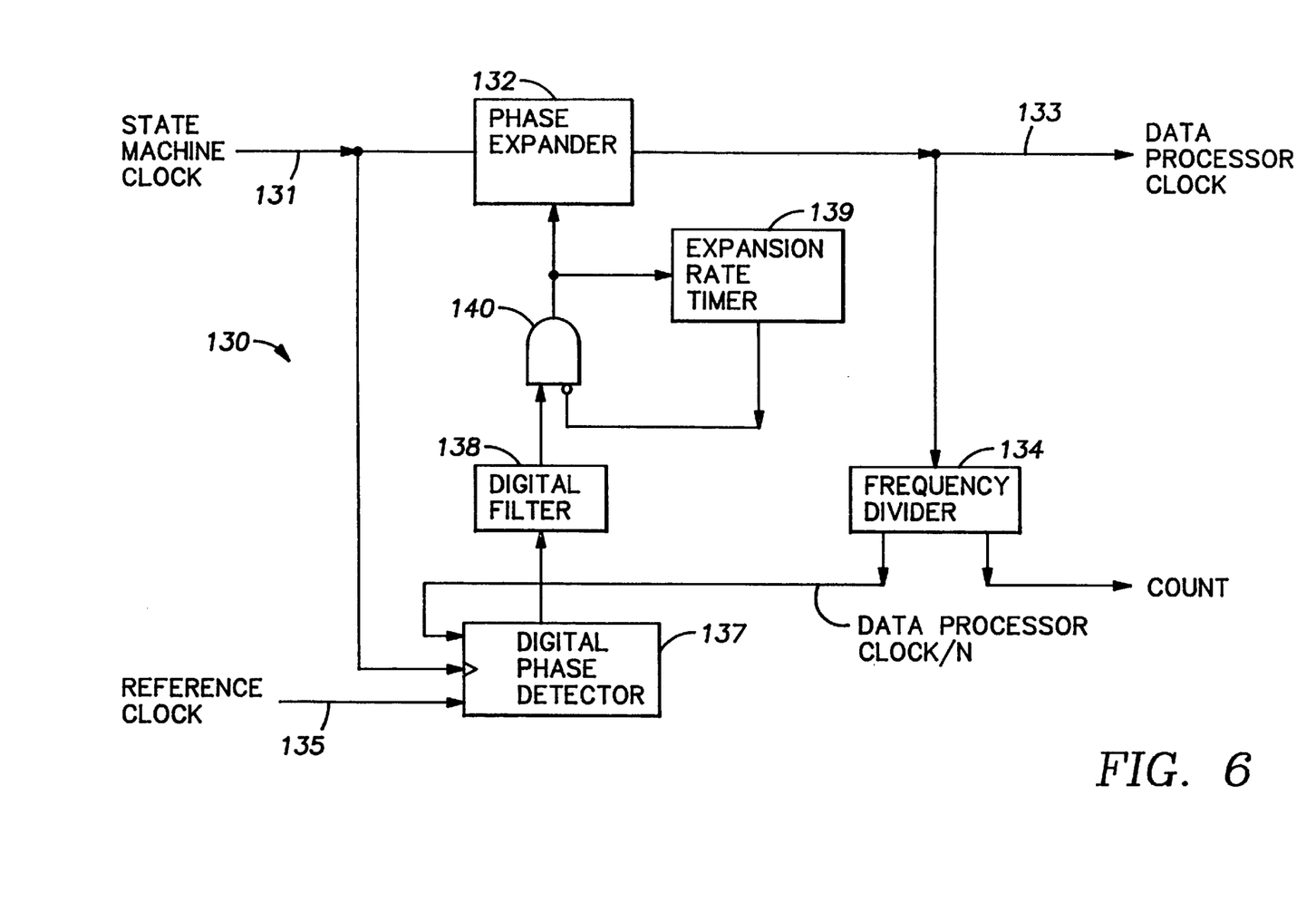
FIG. 6 is a block diagram of a second embodiment of the state machine phase lock loop of the present invention.

Turning now to FIG. 6, there is shown a block diagram of a second embodiment of a state machine phase lock loop incorporating the present invention. The state machine clock is received on a line 131 and is fed to a phase expander 132 which generates the data processor clock on an output line 133. The data processor clock is fed to a frequency divider 134 which divides the data processor clock by a number N to arrive at the reference clock frequency. The frequency divider 134 also provides a count to the data processor unit so that the data processor unit may synchronize the reception of data, or the performance of other operations, in synchronism with the reference clock, and therefore in synchronism with other synchronized data processing units in the data processing system.

In order to precisely synchronize the phase of the data processing clock 133 with the reference clock, the reference clock and the divided data processor clock from the frequency divider 134 are fed to a digital phase detector 137. The digital phase detector 137 detects when the data processor clock phase has been expanded out of synchronism by a predetermined amount with respect to the reference clock. The output of the digital phase detector 137 is fed to a digital filter 138 which insures that the phase relationship detected by the phase detector 137 occurs for a number of cycles of the reference clock. This insures that phase expansion is not triggered simply by noise on the reference clock line 135, and so that any reference clock jitter is also suppressed to a certain degree. Once it is virtually certain that the phase error condition has resulted from phase error of the reference clock and not noise, the digital filter 138 triggers the phase expander 132 to bring the data processor clock in phase synchronism with the reference clock.

Preferably, the state machine clock 131 is only slightly higher in frequency than the frequency required for synchronizing the data processor clock to the reference clock, so that the phase expander 132 should be triggered at a relatively low rate compared to the frequency of the reference clock 135. Therefore, to further reject noise which might be present on the input line 135 for the reference clock, the state machine phase lock loop 130 includes a means for limiting the rate of phase expansion, such as an expansion rate timer 139 and a gate 140. When the phase expander 132 is enabled, the expansion rate timer 139 is triggered so as to inhibit additional phase expansion until after a certain duration of time. Alternative means could be used for inhibiting the rate of phase expansion, for example, the digital filter 138 could be cleared or reset so as to provide some limiting of the rate of phase expansion even in the absence of the expansion rate timer 139.

Figure 7:
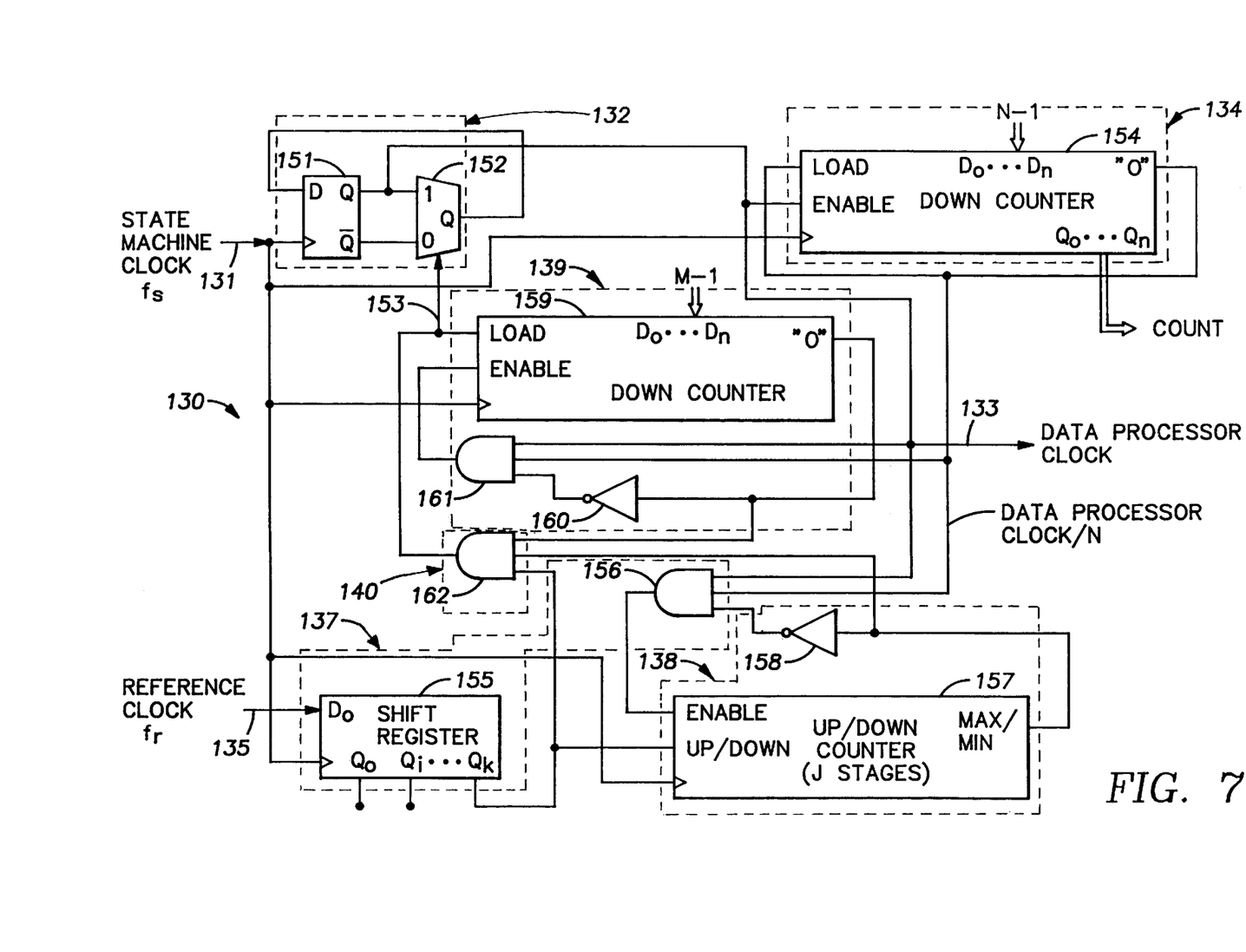
FIG. 7 is a schematic diagram of a specific circuit for the state machine phase lock loop generally shown in FIG. 6.

Turning now to FIG. 7, there is shown a detailed schematic diagram of specific circuitry for the state machine phase lock loop 130 of FIG. 6. The phase expander 132 includes a D flip-flop 151 and a multiplexer 152. Usually, the multiplexer 152 receives the complement output of the flip-flop 151 and feeds it back to the D input of the flip-flop. Therefore, the state of the flip-flop toggles during each leading edge of the state machine clock so as to provide a symmetrical data processor clock at one-half of the frequency of the state machine clock. However, when a logic one is asserted on a select input 153 of the multiplexer 152, the true output of the D flip-flop is fed back to its data input so that toggling is inhibited and the phase of the data processor clock is expanded by 180° per cycle of the state machine clock.

The frequency divider 134 is shown as a down counter 154 preset by a constant value N−1 so as to divide the data processor clock by N. It is assumed that the down counter has synchronous data inputs, as well as a synchronous load and synchronous enable input. Therefore, the down counter 134 could have a construction similar to the standard TTL counter part no. 54169.

The phase expander 132 can be viewed as a first stage of a frequency divider or counter including the down counter 154 as a second stage. If the number N is a power of two, then a synchronous binary counter similar to standard TTL part no. 54163A could be substituted for the flip-flop 151, multiplexer 152, and down counter 154.

The digital phase detector 137 includes a shift register 155, which is clocked by the state machine clock 131 and samples the reference clock on line 135. The shift register 155 has a number of stages so that any metastable state caused by sampling a voltage on the reference clock line 135 at the logic threshold has an infinitesimal probability of propagating all of the way through the shift register. Therefore, it can be assumed that the output of the shift register 155 will either be a logic zero or a logic one.

The digital phase detector 137 also includes logic such as an AND gate 156, which, together with a logic one from the shift register 155, causes the digital filter 138 to detect and accumulate occurrences of the phase error condition. The gate 156 receives the data processor clock and the data processor clock divided by N from the counter 154. Therefore, the gate 156 is enabled only during every 2N cycles of the state machine corresponding to the particular phase relationship for triggering of the phase expander 132. Specifically, the digital phase detector 137 detects when the reference clock has a logic high state coincident with clocking by said clocking signal and a predefined state of said frequency divider. If the shift register 155 has six stages (i.e., k=5), and the value N is 3 so that the down counter 154 is loaded with a value of N−1=2, then the digital phase detector 137 will detect the phase relationship illustrated in FIG. 3C.

The digital filter 138 is provided by an up-down counter 157 and an inverter 158 feeding a signal to the gate 156 so as to prevent the up-down counter 157 from "rolling over." In other words, the up-down counter 157 will not count up when it is at its maximum value, and it will not count down when it is at its minimum value. Therefore, the up-down counter functions as a digital integrator for integrating the occurrences of the phase condition. If the up-down counter has J stages, then it will have to accumulate the phase error condition at least $2^J$ times in order to enable phase expansion. The up-down counter has a construction, for example, similar to the standard TTL part no. 54169.

The expansion rate timer 139 is shown in FIG. 5 as including a down counter 159, an inverter 160, and a AND gate 161. The AND gate 61 is enabled by the data processor clock and the data processor clock/N so that it counts at a rate of approximately the reference clock frequency. Moreover, the "zero" output of the down counter is inverted by the inverter 160 and fed to the AND gate 161 so as to disable counting after counting down from a preset value of M minus 1. The phase expander 132 is enabled by a gate 162 when the up-down counter 157 is at its maximum value and receives an UP signal from the shift register 155 so long as the down counter 159 is not counting. Therefore, when the down counter 159 is counting, the phase expander 132 is inhibited. When the down counter 159 has reached its minimum value of zero, the down counter no longer inhibits the gate 162 and the phase expander 132. Once the phase expander 132 is enabled and phase expansion occurs, the down counter becomes loaded with its preset value M minus 1 so as to inhibit any further phase expansion for approximately M cycles of the reference clock.

Clocks for data processors may have accuracies on the order of 75 to 200 ppm. Therefore, the usual instantaneous frequency of data processor clock need only be increased in frequency by a relatively small amount to practice the present invention. The relative "overspeed" of the state machine clock frequency fs, for example, should slightly exceed the sum of the state machine clock accuracy and the reference clock accuracy by a significant margin to ensure that the instantaneous frequency of the data processor clock is always higher than its synchronous frequency so that synchronization may result from selective phase expansion. The relative "overspeed" of the state machine clock fs can be defined as:

$$\text{overspeed} = (f_s/2N - f_r)/f_r$$

where fr is the reference clock frequency.

The nominal overspeed of the processor clock should not be much greater than that required to guarantee overspeed, because an excessive overspeed represents a phase contraction. With oscillator accuracies of 75 and 200 ppm, a 12ns external cycle and a 4ns internal cycle, the phase contraction could be less than 1 ps. This does not impact processor performance, although the yield of processor chips is decreased slightly because the chips must run 1 ps faster per processor cycle.

One choice for the value of M is to select M such that the minimum rate of the data processor clock is less than its synchronous frequency by the same amount that its maximum rate exceeds its synchronous frequency. In this case:

The maximum rate of the data processor clock is $f_s/2$.

The minimum rate of the data processor clock is $f_{min}$:

$$f_{min} = [f_s - f_{min}/NM]2$$

$$2f_{min} = f_s - f_{min}/NM$$

$$f_{min}\left(2 + \frac{1}{NM}\right) = f_s$$

$$f_{min} = \frac{f_s}{2 + \frac{1}{NM}}$$

Let $\Delta f = f_{max}/N - f_r = f_s/2N - f_r$.

For $\Delta f$ also to $= f_r - f_{min}/N$, then $f_s/2N - f_r = f_r - f_{min}/N$ $$f_s/2N = 2f_r - \frac{f_s}{2N + \frac{1}{M}}$$

$$\frac{f_s}{2N + \frac{1}{M}} = 2f_r - \frac{f_s}{2N}$$

$$f_s = 2N\left(2f_r - \frac{f_s}{2N}\right) + \frac{1}{M}\left(2f_r - \frac{f_s}{2N}\right)$$

$$\frac{1}{M}\left(2f_r - \frac{f_s}{2N}\right) = f_s - 2N\left(2f_r - \frac{f_s}{2N}\right)$$

$$M = \frac{\left(2f_r - \frac{f_s}{2N}\right)}{f_s - 2N\left(2f_r - \frac{f_s}{2N}\right)}$$

$$M = \frac{2f_r - \frac{f_s}{2N}}{2f_s - 4Nf_r} = \frac{f_r - \frac{f_s}{4N}}{f_s - 2N\,f_r}$$

$$M \approx \frac{f_r}{2[f_s - 2N\,f_r]}$$

In view of the above, there has been described a state machine phase lock loop for synchronizing different or independent time domains, such as the internal time domain of a processor to an external system domain. Synchronization is achieved to within one period of the state machine clocking signal, provided that the data processor clock is always gaining phase with respect to the reference clock. The state machine has negligible clock contraction, is low risk, and requires negligible die area for an on-chip implementation.

What is claimed is:

1. A method of synchronizing a first signal to a second signal, said method comprising periodically repeating the steps of:

a) providing said first signal and said second signal, said second signal having a predefined frequency, said first signal having an instantaneous frequency greater than said predefined frequency;

b) detecting a predefined phase relationship between said first signal and said second signal; and c) when said predefined phase relationship is detected, always expanding said first signal in phase by a predetermined amount to synchronize said first signal to said second signal.

2. The method as claimed in claim 1, further comprising the step of generating said first signal by clocking a frequency divider with a clocking frequency, and wherein said step c) is performed by inhibited by the clocking of said frequency divider.

3. The method as claimed in claim 2, wherein step c) is performed by inhibiting the clocking of said frequency divider for only one cycle of said clocking frequency.

4. The method as claimed in claim 2, including the step of synchronizing said second signal to said clocking frequency.

5. The method as claimed in claim 4, wherein said step of synchronizing is performed by sampling said second signal in synchronism with said clocking frequency.

6. The method as claimed in claim 2, wherein said predetermined phase relationship is detected when said second signal has a predetermined logic state and when said frequency divider has a predefined state coincident with assertion of said clocking signal.

7. The method as claimed in claim 1, wherein said step c) is performed only when said predefined phase relationship is detected in said step b) for each of a plurality of cycles of said first signal and said second signal.

8. The method as claimed in claim 1, wherein said step c) is prevented from being performed at a rate greater than a predetermined maximum rate.

9. A digital phase lock loop for generating a first frequency signal synchronized to a second frequency signal at a frequency lower than said first frequency signal, said digital phase lock loop comprising:
   a counter having a clock input for receiving a clocking signal, the counter having a first stage responsive to an inhibit input for generating said first frequency signal, and the counter also having an additional stage for dividing said first frequency signal down to said second frequency; and
   a digital phase detector having a first input for receiving said second frequency signal, a second input connected to an output of said counter for receiving said divided first frequency signal, a clock input connected to the clock input of said counter, and a phase detection output connected to said inhibit input of said counter for inhibiting said counter when said second frequency signal has a predetermined logic state and when said counter has a predefined state coincident with assertion of said clocking signal.

10. The digital phase lock loop as claimed in claim 9, further comprising a digital filter connecting said output of said digital phase detector to said inhibit input of said counter such that said counter is inhibited only when said digital phase detector detects that said second frequency signal has said predetermined logic state coincident a plurality of times with said predefined state of said counter and with assertion of said clocking signal.

11. The digital phase lock loop as claimed in claim 9, further comprising means for preventing said counter from being inhibited at a rate in excess of a predetermined rate.

12. The digital phase lock loop as claimed in claim 9, wherein said digital phase detector comprises a flip-flop clocked by said clocking signal and receiving said second frequency signal for detecting coincidence of said predetermined logic state with said clocking by said clocking signal, and a logic gate having a first input connected to an output of said flip-flop and a second input connected to said output of said counter for detecting coincidence with said predefined state of said counter.

13. A method for synchronizing data processing units in a data processing system comprising the steps of:
   (a) generating a reference clock at a reference frequency and distributing the reference clock to the data processing units; and
   (b) generating a respective data processor clock at each of the data processing units, each data processor clock being synchronized to the reference clock by
      (i) dividing the frequency of said each data processor clock to obtain a quotient signal having an instantaneous frequency which is greater than said reference frequency, and
      (ii) periodically detecting a predefined phase relationship between said quotient signal and said reference signal, and when said predefined phase relationship is detected, always expanding said each data processor clock in phase by a predetermined amount to synchronize each data processor clock to the reference clock.

14. The method as claimed in claim 13, wherein said each data processor clock is generated by clocking a frequency divider with a clocking signal, and wherein said each data processor phase clock is expanded in phase by inhibiting the clocking of said frequency divider.

15. The method as claimed in claim 14, wherein said clocking of said frequency divider is inhibited for only one cycle of said clocking signal each time that said predefined phase relationship is detected between said quotient signal and said reference signal.

16. The method as claimed in claim 14, wherein said predetermined phase relationship is detected when said second signal has a predetermined logic state and when said frequency divider has a predefined state coincident with assertion of said clocking signal.

17. The method as claimed in claim 16, wherein the detection of said predetermined phase relationship includes sampling said reference clock in synchronism with said clocking signal.

18. The method as claimed in claim 17, wherein samples of said reference clock are shifted through a shift register.

19. The method as claimed in claim 13, wherein said each data processor clock is expanded in phase only when said predetermined phase relationship is detected for each of a plurality of cycles of said reference signal.

20. The method as claimed in claim 13, wherein said each data processor clock is expanded in phase at a limited rate.

21. A digital phase lock loop for generating a first frequency signal synchronized to a second frequency signal, said digital phase lock loop comprising:
   a digital state machine having a clock input for receiving a clocking signal, an inhibit input, and an output for generating said first frequency signal in response to said clocking signal and expanding phase of said second frequency signal in response to said inhibit signal; and
   a digital phase detector having a first input receiving said second frequency signal, a second input receiving said first frequency signal from said output of said digital state machine, and a phase detector output connected to said inhibit input of said digital state machine to supply said inhibit signal when said second frequency signal has a predefined phase relationship with respect to said first frequency signal.

22. The digital phase lock loop as claimed in claim 21, further including a synchronizer having an input connected to the phase detection output of said digital phase detector and an output connected to said inhibit input of said digital state machine.

23. The digital phase lock loop as claimed in claim 21, further including a secondary phase detector having a first input for receiving said first frequency signal from said output of said digital state machine, a second input for receiving said second frequency signal, and a phase detection output connected to said state machine to disable said expanding of phase of said second frequency signal when said second frequency signal has a second predefined phase relationship with respect to said first frequency signal.

24. The digital phase lock loop as claimed in claim 21, wherein said phase detector includes a first D flip-flop clocked by said second frequency signal and sampling said first frequency signal, and further including a second D flip-flop clocked by a delayed version of said second frequency signal and sampling said first frequency signal, said second D flip-flop having a phase detection output connected to said state machine to disable said expanding of phase of said second frequency signal when said second frequency signal has said predefined phase relationship with respect to said delayed version of said first frequency signal.

25. The digital phase lock loop as claimed in claim 24, wherein said first D flip-flop has a reset input connected to said phase detection output of said second D flip-flop.

\* \* \* \* \*